United States Patent
Armer et al.

(10) Patent No.: US 7,098,394 B2
(45) Date of Patent: Aug. 29, 2006

(54) METHOD AND APPARATUS FOR POWERING CIRCUITRY WITH ON-CHIP SOLAR CELLS WITHIN A COMMON SUBSTRATE

(75) Inventors: John Armer, Middlesex, NJ (US); Thomas Richard Senko, Plainsboro, NJ (US)

(73) Assignee: Pharmaseq, Inc., Monmouth Junction, NJ (US)

( * ) Notice: Subject to any disclaimer, the term of this patent is extended or adjusted under 35 U.S.C. 154(b) by 90 days.

(21) Appl. No.: 10/393,586

(22) Filed: Mar. 21, 2003

(65) Prior Publication Data

US 2003/0172968 A1    Sep. 18, 2003

Related U.S. Application Data

(63) Continuation of application No. 09/858,295, filed on May 15, 2001, now abandoned.

(51) Int. Cl.
H01L 31/04 (2006.01)
H01L 31/05 (2006.01)

(52) U.S. Cl. .............. 136/244; 136/245; 136/249; 136/255; 136/293; 257/184; 257/197; 257/187; 257/431; 257/443; 257/461; 257/462; 257/465; 438/7; 438/6; 438/80

(58) Field of Classification Search .......... 136/244, 136/245, 249, 255, 293; 257/184, 197, 187, 257/431, 443, 461, 462, 465; 435/4, 6; 438/7, 6, 80

See application file for complete search history.

(56) References Cited

U.S. PATENT DOCUMENTS

| | | | |
|---|---|---|---|
| 3,952,302 A | 4/1976 | Mullins | |
| 4,081,820 A * | 3/1978 | Chitre | 136/249 |
| 4,090,213 A * | 5/1978 | Maserjian et al. | 136/255 |
| 4,184,894 A * | 1/1980 | Lindmayer et al. | 136/249 |
| 4,295,058 A * | 10/1981 | Lade et al. | 307/117 |
| 4,435,822 A | 3/1984 | Spencer et al. | |
| 4,471,385 A | 9/1984 | Hyatt | |
| 4,523,217 A * | 6/1985 | Jibu | 327/514 |
| 4,628,542 A | 12/1986 | Nomiyama et al. | |
| 4,703,474 A | 10/1987 | Foschini et al. | |
| 4,755,016 A | 7/1988 | DeLoach, Jr. et al. | |
| 4,824,251 A | 4/1989 | Slotwinski et al. | |
| 4,898,443 A | 2/1990 | Epworth et al. | |
| 4,910,726 A | 3/1990 | Stanley | |
| 4,912,522 A | 3/1990 | Oates et al. | |
| 4,918,747 A | 4/1990 | Bekooij | |
| 4,949,389 A | 8/1990 | Allebach et al. | |
| 4,995,052 A | 2/1991 | Thorvaldsen | |
| 5,027,435 A | 6/1991 | Chraplyvy et al. | |

(Continued)

OTHER PUBLICATIONS

Luo et al, "Demonstrations of 4H-SiC power bipolar junction transistors," Electronic Letters, vol. 36, No. 17, pp. 1496-1497, Aug. 2000.*

*Primary Examiner*—Alan Diamond
(74) *Attorney, Agent, or Firm*—Morgan Lewis & Bockius LLP

(57) ABSTRACT

A system and method for providing power to a light-powered transponder. In order to create a sufficient voltage differential, two different photovoltaic elements are used. The photovoltaic elements generate voltages of different polarities. Because the photovoltaic elements are used independently to generate voltages with different polarities, the present system can achieve a desired voltage differential despite the inherent difficulties presented by the use of a standard CMOS process.

12 Claims, 3 Drawing Sheets

U.S. PATENT DOCUMENTS

| | | | |
|---|---|---|---|
| 5,062,150 A | 10/1991 | Swanson et al. | |
| 5,115,444 A | 5/1992 | Kirkby et al. | |
| 5,130,717 A | 7/1992 | Ewen et al. | |
| 5,223,044 A | 6/1993 | Asai | |
| 5,223,851 A | 6/1993 | Hadden et al. | |
| 5,278,873 A | 1/1994 | Lowrey et al. | |
| 5,281,855 A | 1/1994 | Hadden et al. | |
| 5,282,074 A | 1/1994 | Miyazaki et al. | |
| 5,300,875 A | 4/1994 | Tuttle | |
| 5,319,438 A | 6/1994 | Kiasaleh | |
| 5,329,394 A | 7/1994 | Calvani et al. | |
| 5,333,000 A | 7/1994 | Hietala et al. | |
| 5,374,935 A | 12/1994 | Forrest | |
| 5,422,752 A | 6/1995 | Hardcastle | |
| 5,442,476 A | 8/1995 | Yamazaki et al. | |
| 5,532,865 A | 7/1996 | Utsumi et al. | |
| 5,535,189 A | 7/1996 | Alon et al. | |
| 5,623,359 A | 4/1997 | Giles et al. | |
| 5,641,634 A * | 6/1997 | Mandecki | 435/6 |
| 5,675,429 A | 10/1997 | Henmi et al. | |
| 5,727,110 A | 3/1998 | Smith et al. | |
| 5,736,332 A | 4/1998 | Mandecki | |
| 5,796,890 A | 8/1998 | Tsuji et al. | |
| 5,822,200 A | 10/1998 | Stasz | |
| 5,910,851 A | 6/1999 | Flaherty | |
| 5,978,118 A | 11/1999 | Flaherty | |
| 5,981,166 A | 11/1999 | Mandecki | |
| 5,995,253 A | 11/1999 | Flaherty | |
| 6,001,571 A | 12/1999 | Mandecki | |
| 6,014,236 A | 1/2000 | Flaherty | |
| 6,028,525 A | 2/2000 | Shukla et al. | |
| 6,046,003 A | 4/2000 | Mandecki | |
| 6,455,766 B1 * | 9/2002 | Cook et al. | 136/244 |
| 6,680,468 B1 * | 1/2004 | Wang | 250/214 R |
| 2001/0045899 A1 | 11/2001 | Hoek | |

* cited by examiner

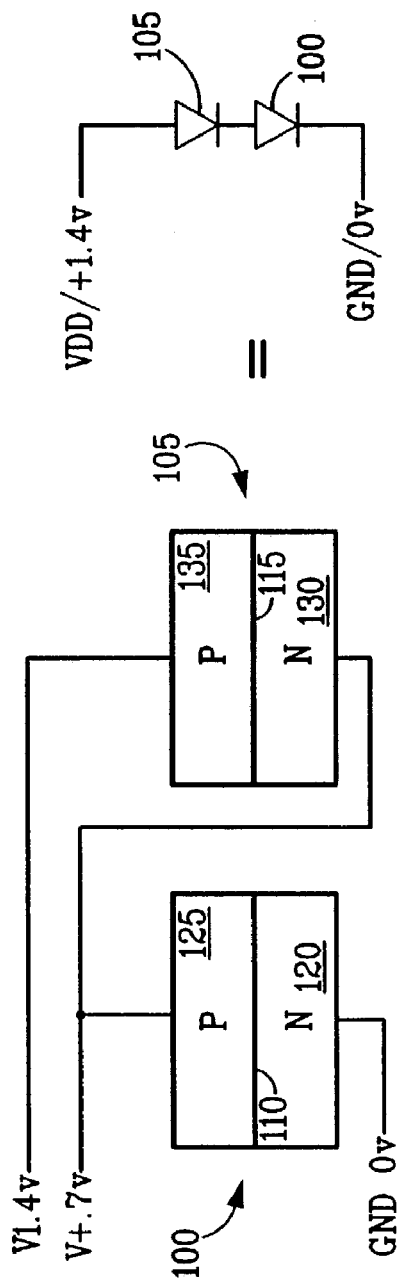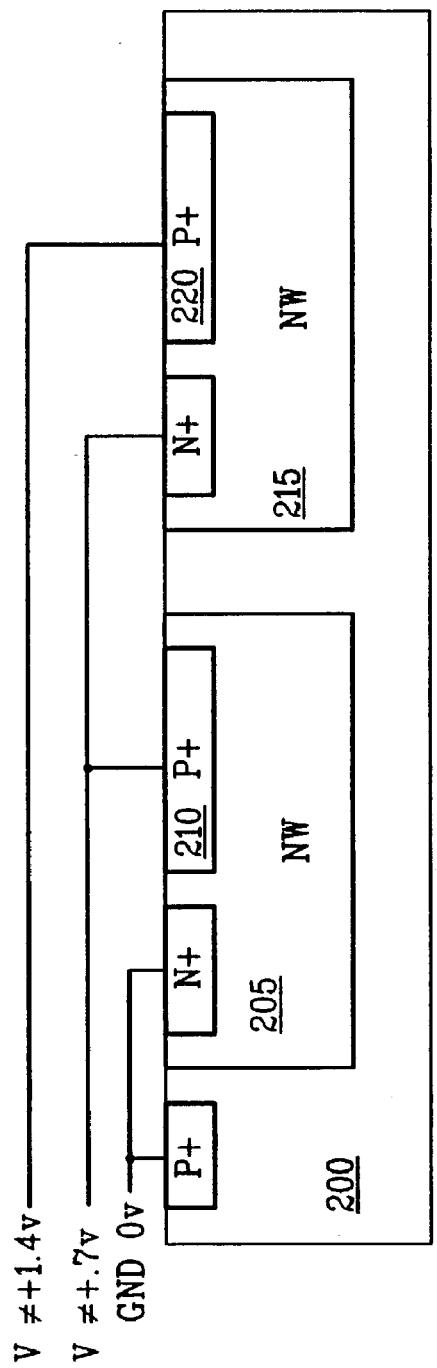

METHOD AND APPARATUS FOR POWERING CIRCUITRY WITH ON-CHIP SOLAR CELLS WITHIN A COMMON SUBSTRATE

This application is a continuation of Ser. No. 09/858,295 filed May 15, 2001, now abandoned.

BACKGROUND OF THE INVENTION

This invention relates generally to electronic radio frequency identification tags and specifically to small electronic transponders that store and transmit information. In particular, the present invention relates to the use of light to generate sufficient power for transponders.

Electronic transponders are used in a wide variety of applications to store and transmit information. A transponder functions by receiving a transmission request and, in turn, transmitting a response. Typically, this response is an identification signal, often comprising a serial number.

In World War II, transponders were used to identify aircraft. The transponder assured the requesting aircraft that the associated aircraft was a friendly aircraft by transmitting an identification code. Early versions of electronic transponders supplied power by way of a battery or a solenoid. However, batteries and solenoids are relatively large, and therefore severely restrict the ability to reduce the size of electronic transponders.

An antenna external to the transponder broadcasted identification information. This external antenna was necessary to generate a RF signal strong enough to be received and demodulated by a receiver. An external antenna, however, further increases the size of the transponder.

Today, transponders are used for a variety of purposes ranging from identification of wildlife to electronic article surveillance (EAS). Typically, transponders utilize a radio frequency identification (RFID) system. These systems operate without visual contact. For example, EAS systems typically employ a closed loop of a conductive substance that responds to a generated radio frequency (RF) field. These transponders, also called tags due to their ability to "tag" a consumer item to prevent shoplifting, are deactivated when a product is purchased. To further this goal, EAS systems may transmit a description of the item to which the tag is affixed.

Transponders are also beneficial for applications where it is highly desirable to reduce the size of the transponder to very small dimensions. For example, electronic transponders aid in the detection of biomolecules in samples when performing solid-phase assays. U.S. Pat. Nos. 5,641,634, 5,736,332, 5,981,166, and 6,001,571 respectively disclose the use of transponders for detecting biomolecules, determining the sequence of nucleic acids, screening chemical compounds, and performing multiplex assays for nucleic acids, and are herein specifically incorporated by reference. For these applications, the transponder must be significantly reduced in size.

For use in chemically hostile environments, as those often used in solid-phase assays, external antennas and power sources utilized in earlier prior art transponders needed to be protected. Therefore, the entire transponder, including the power source and antenna, would be enclosed in a protective material, such as a glass bead. This enclosure further added to the size of the transponder.

As disclosed in U.S. Pat. No. 5,641,634, miniature transponders, also referred to as microtransponders, using photovoltaic cells to provide power have been developed. Photo-activated transponders enable smaller dimensions. Further, by providing a monolithic assembly that includes an antenna, the transponder disclosed in U.S. Pat. No. 5,641,634 further enables a reduction in size.

These transponders are typically formed on a silicon wafer and protected by a thin layer of silicon dioxide ($SiO_2$). $SiO_2$ has the same chemical properties as glass with respect to chemically hostile environments. Therefore, the transponder does not need to be enclosed in a glass encasement. Alternatively, the transponder may be coated with a variety of transparent or semitransparent materials, such as plastic or latex.

In many applications, it is desirable to have a small transponder that outputs identification data. It is further desirable to create a purely passive device that does not depend on the operation of self-contained batteries. Photo-activated transponders provided an advantage over the prior art due to their inactivity without light illumination. A narrowly focused laser light source may enable a single transponder at a time, even when a large number of transponders are present in the assay. Only the illuminated transponder transmits data and other transponders are inactive. The reduction in the number of transmitting transponders significantly reduces noise level. If the light source is more broadly applied, an increased number of transponders may respond. Thus, the light source can be adjusted to control which transponders will respond during an assay.

SUMMARY OF THE PRESENTLY PREFERRED EMBODIMENT

The present invention is defined by the following claims, and nothing in this section should be taken as a limitation on those claims. By way of introduction, the embodiments described below include a method and apparatus for supplying power from a light source for a transponder.

In order to minimize size and cost, it is desirable to manufacture a transponder using a standard CMOS process on a single die. Standard CMOS processes utilize a common, conductive substrate. Thus, without additional processing, any one photovoltaic element is not completely isolated from another.

In instances where more than one photovoltaic element is used to supply sufficient power, the common substrate causes difficulties. For example, if an increased voltage differential is desired, two photodiodes may be connected in series. In processes where the two photodiodes are isolated, the series connection will double the voltage produced. If the two photodiodes are not isolated, as with the use of a single die created through a standard CMOS process, an increased voltage potential may not result.

In order to supply sufficient power to the logic circuitry of the transponder, the present invention utilizes two photovoltaic elements. The first photovoltaic element produces a positive voltage. The second photovoltaic element produces a negative voltage. Used in conjunction, the voltage difference between the two elements is approximately double the voltage potential of any one photovoltaic element. Here, the positive supply is connected to a load terminal and the negative supply is connected to an other load terminal. Because the photovoltaic elements are used independently to generate voltages with different polarities, the present system can achieve a desired voltage differential despite the inherent difficulties presented by the use of a standard CMOS process or a common substrate.

Additionally, a third photovoltaic element may be used as a separate power source for the transponder antenna. By using a separate power supply for the antenna, the logic circuitry is not affected by the operation of the antenna.

Further aspects and advantages of the invention are discussed below in conjunction with the preferred embodiments.

BRIEF DESCRIPTION OF THE DRAWINGS

FIG. 1 is a schematic of a prior art system of connecting two isolated photodiodes in series.

FIG. 2 is a depiction of an ineffective power supply system for use with a transponder.

DETAILED DESCRIPTION OF THE PRESENTLY PREFERRED EMBODIMENTS

Figure 3:
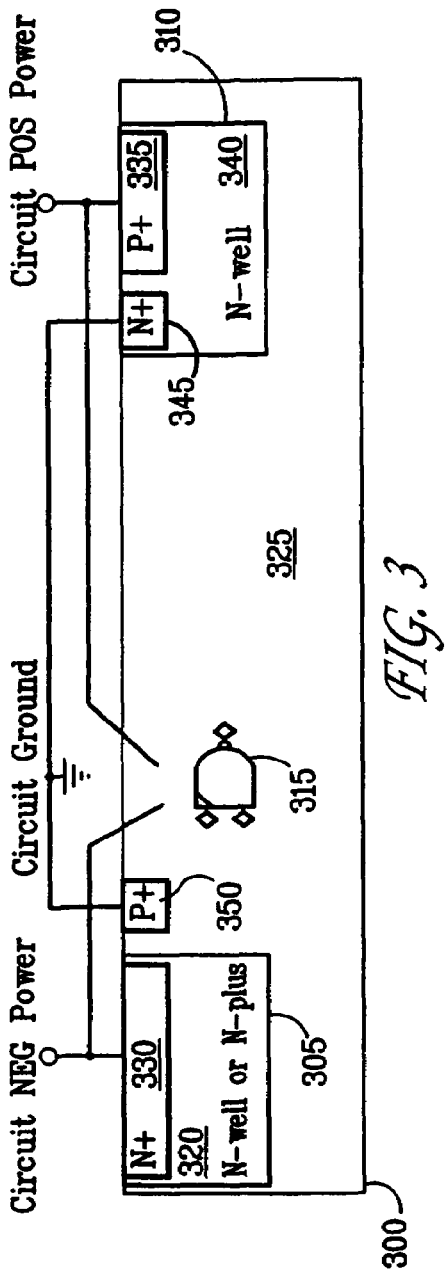
FIG. 3 is a depiction of an embodiment for providing power from light for a transponder.

An embodiment of the present invention uses one photovoltaic element as a positive power supply and uses another photovoltaic element as a negative power supply. By using two power supplies with different polarities, the embodiment provides an increased voltage differential for logic circuits with a common substrate. Such a common substrate may be formed through the use of standard CMOS process techniques.

In order to drive the logic circuitry of the transponder, the photovoltaic elements provide at least 1.0 volts. A single photodiode can provide 0.7 V.

The common substrate creates difficulties in designing a power supply system. FIG. 1 shows two physically isolated photodiodes connected to produce a 1.4 V power supply. The first photodiode 100 is connected in series with the second photodiode 105. The photodiodes generate a voltage differential though the PN junctions 110 and 115. The cathode 120 of the first photodiode 100 is connected to ground. The anode 125 of the first photodiode 100 yields +0.7 V. The cathode 130 of the second photodiode 105 is connected to the anode 125 of the first photodiode 100. As with the first photodiode 100, the second photodiode 105 raises the voltage +0.7 V. Thus, the anode 135 of the second photodiode yields +1.4 V. Because the photodiodes 100, 105 are physically isolated, the two photodiodes 100, 105 may be connected in series to double the voltage differential. If two PN diodes were arranged in series on a common substrate, however, the desired voltage differential may not result because the diode cathodes are not isolated by a dielectric.

As shown in FIG. 2, the N-wells 205, 215 each share a common conductive P-type substrate 200 which also acts as a second anode to each. The common substrate 200 is ground for both the power supply and load circuits. A first N-well 205 is located in the substrate 200. Independent of any of the connections, the first N-well would yield approximately −0.7 V with respect to ground. Connecting the first N-well to ground forces the first N-well to 0.7 V. This connection now allows a P+ implant 210 in the first N-well 205 to yield a positive voltage. This first P+ implant 210 in the N-well 205 effectively supplies +0.7 V. A similar arrangement connected in series, however, may not produce 1.4 V. Here, the N-well 215 of the second photovoltaic element is connected to the P+ implant 210 of the first photovoltaic element. Again, independent of any of the connections, the second N-well by itself would yield approximately −0.7 V with respect to ground. At first glance, it may appear that connecting the second N-well 215 to the P+ 210 of the first photovoltaic element would force the N-well 215 to +0.7 V and that a +1.4 V potential could then be achieved at the second P+ implant 220. For similarly sized devices, this does not occur because the second PN junction of the second photovoltaic element (that of the N-well 215 and the substrate 200) overpowers the first photovoltaic cell by pulling down the voltage differential. Thus, the second P+ implant 220 does not yield 1.4 V.

The second PN junction of the second photovoltaic element dominates the power supply and yields an overall negative voltage at the connection between the first P+ implant 210 and the second N-well 215. As a result, the voltage at the second P+ implant 220 is approximately 0 V. This occurs because an N-well-substrate region has a stronger current producing capability than a P+− implant-N-well region.

The inability to effectively isolate the two power supplies in a standard CMOS process precludes the effective use of two photovoltaic power supplies in series. Thus, the use of two positive power supplies or two negative power supplies in order to achieve a higher voltage differential is not effective without additional cost or size demands.

Instead of providing one power terminal to the load and another terminal that simply connects the power supply system and the load to ground, the present embodiments utilize two power terminals in a connection with a load. Specifically, the load connects with a positive voltage terminal and a negative voltage terminal. Because the voltage differential between the positive voltage terminal and the negative voltage terminal is at least one volt, the logic circuitry of the transponder may be effectively driven.

FIG. 3 is a graphical depiction of an embodiment of the present invention. A silicon die 300 contains a negative supply 305, a positive supply 310, and a load 315. The negative supply 305 is created through the use of an N-well 320 in a P substrate 325. Alternatively, the negative supply could be created with N+ implant 330 directly in the P substrate 325, i.e., without the N-well 320. The negative supply 305 generates −0.7 V through a PN junction. The negative supply 305 has an N+ implant 330 connected with one terminal connection of the load 315. The negative supply 305 can supply ample current to the load 315.

The positive supply 310 comprises a P+ implant 335 inside an N-well 340 located in the P substrate 325. The positive supply can be viewed as vertical PNP bipolar junction transistor where the substrate 325 is the collector, the N-well 340 is the base, and the P+ implant 335 within the N-well 340 is the emitter. The positive supply 310 has two junctions in which a voltage potential may be created. The first junction is between the P+ implant 335 and the N-well 340. Here, a +0.7 V voltage difference is created. The second junction is between the N-well 340 and the P substrate 325 and a −0.7 V voltage potential may be created. Simultaneous illumination essentially short circuits the supply. Without any other connection, illuminating the device would result in 0 V because the junctions would cancel each other out.

To create a +0.7 V result, the N-well 340 via N+ implant 345 and the substrate 325 via P+ implant 350 are ground. Grounding the N-well 340 prevents the second junction from driving the positive supply 310 negatively toward 0V. By tying the N-well 340 (base) to the P substrate 325 (collector), which is at 0V, the P implant 335 (emitter) within the N-well 340 rises to +0.7 V.

In this embodiment, two separate power supplies are created with a common substrate 325. The negative power supply 305 comprising an N-well 320 in the P substrate 325 yields approximately –0.7 V. The positive power supply 310 comprising a P+ implant 335 in an N-well 340 in the P substrate 325 yields approximately +0.7 V. Used in conjunction the two power supplies create a voltage differential of approximately 1.4 V. This voltage differential is sufficient to drive the circuit logic represented as the load 315. Other voltages with the same or different amplitude for the positive and negative supplies may be used.

The embodiment of FIG. 3 uses a P substrate 325. Thus, the negative supply 305 uses an N-well 320 and the positive supply 310 uses a P+ implant 335 in an N-well 340. In the alternative (not shown), an N substrate may be used. If an N substrate is used, the negative power supply 305 is represented as an NPN transistor while the positive power supply 310 is represented as a PN diode. The negative power supply 305 comprises an N+ implant inside a P well located in the N substrate. The positive supply 310 comprises a P well located in the N substrate.

Using either embodiment, the power supply source represented as a PN diode (i.e. the negative power supply in the P substrate embodiment and the positive power supply in the N substrate embodiment) provides more current than the other power supply. The less robust power supply (i.e., the positive power supply in a P substrate embodiment and the negative power supply in an N substrate embodiment) is examined to ensure that sufficient power is provided to the load 315.

Figure 5:
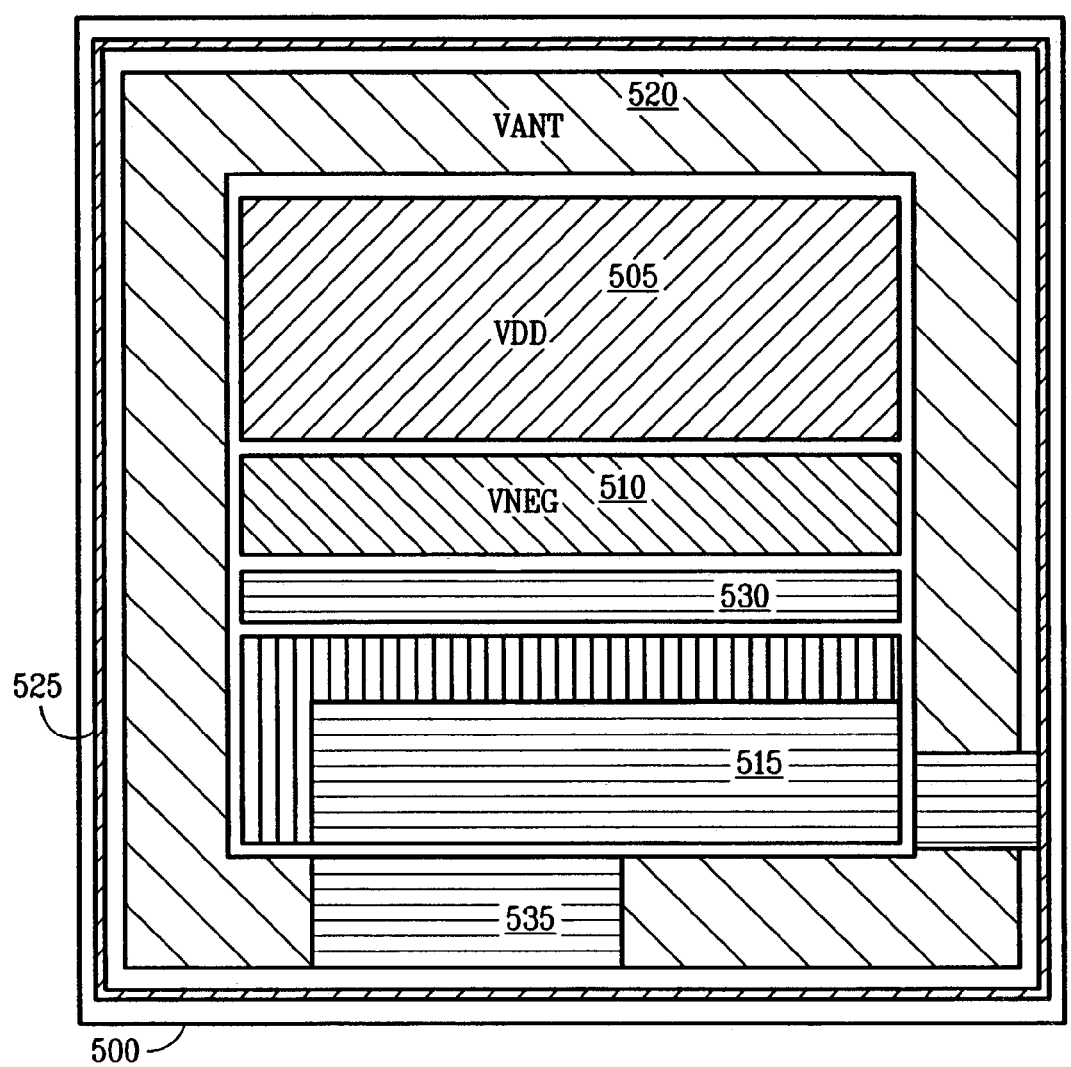
FIG. 5 is a depiction of a die layout of a transponder utilizing an embodiment for providing power from light.

To ensure that sufficient power is delivered by both power supplies, the size of the less robust power supply is increased. For example, as seen in FIG. 5, the cross-sectional area of the negative power supply 505 may be twice that of a positive power supply 510 in an N substrate embodiment. The increased size will boost the current supplying capabilities of the negative power supply (or positive power supply in a P substrate embodiment).

Figure 4:
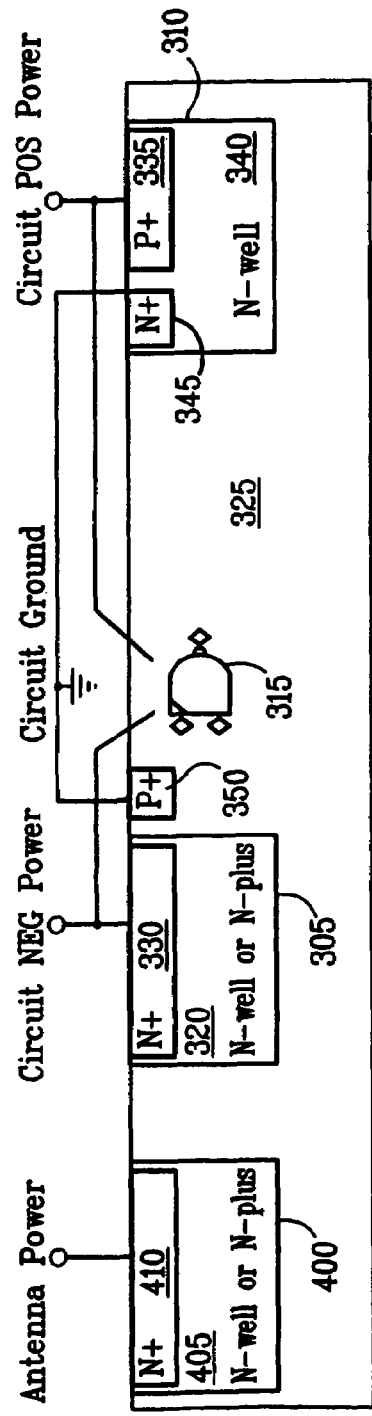
FIG. 4 is a depiction of another embodiment for providing power from light for a transponder.

As seen in FIG. 4, another embodiment utilizes three power supplies. An additional power supply 400 is included with a negative power supply 305 and a positive power supply 310. This additional power supply 400 may be used to generate power for an antenna used to transmit an output signal. By incorporating a third power supply, the antenna does not drain power from the logic power supply. As shown in FIG. 4, the additional power supply 400 comprises an N-well 405 in a P substrate 325. Through an N+ implant 410, a negative voltage may be delivered to the antenna. In this regard, the additional power supply 400 is structurally similar to the negative power supply 305. In the alternative, the additional power supply may be structurally similar to the positive power supply 310. Further, the additional power supply may use a structure different from both the positive and negative power supply. For example, an N+ contact to P substrate junction without an N-well for the P substrate embodiment may be utilized. Further, the additional power supply may be used with an N substrate embodiment as either a P+ contact directly to the N substrate or a P-well to the N substrate.

FIG. 5 shows a layout of a transponder using an embodiment of the invention. The transponder is encompassed on a single die 500. A positive power supply 505 is located adjacent to a negative power supply 510. The positive power supply 505 is larger than the negative power supply 510. Used in conjunction, the positive power supply 505 and the negative power supply 510 provide power for logic circuitry 515.

In an operational transponder, the logic circuitry is shielded to prevent the sources and drains of the NMOS and PMOS devices, as well as the N-wells of the PMOS devices and P-wells of the NMOS devices, from operating as photodiodes. Additionally, to ensure that any light leakage does not create voltage potential that could drain the positive power supply, the logic N-wells are tied to ground. Tying the N-well to ground prevents the PN junction created by the N-well and the P substrate from generating a negative voltage.

Additionally, an antenna power supply 520 is provided. In this embodiment, the antenna power supply 520 comprises an N-well in a P substrate. Thus, the antenna 525 is driven by an additional negative power supply 520.

A clock recovery circuit 530 and an antenna switch 535 are also provided. The performance of clock recovery is discussed in pending U.S. patent application Ser. No. 09/699,660, filed Oct. 30, 2000, herein incorporated by reference.

The antenna 525 comprises a wire loop surrounding the die utilizing the standard metalization steps in the standard CMOS process. Other antennae, such as microelectomechanical machining (MEMS), may be used. Through the antenna 525, the transponder transmits an output signal. The antenna switch 535 controls when the transponder is transmitting.

It is to be understood that a wide range of changes and modifications to the embodiments described above will be apparent to those skilled in the art and are contemplated. It is, therefore, intended that the foregoing detailed description be regarded as illustrative rather than limiting, and that it be understood that it is the following claims, including all equivalents, that are intended to define the spirit and scope of the invention.

What is claimed is:

1. A power supply for powering a logic circuit, comprising:
   at least first and second photodiodes connected in series and integrated on a common substrate, said first photodiode having a first terminal and a second terminal, said second photodiode having a first terminal and a second terminal, wherein said first terminal of said first photodiode and said first terminal of said second photodiode are in electrical contact with the common substrate;
   wherein, upon illumination, the power supply generates a first potential difference between the second electrode of the first photodiode and the second electrode of the second photodiode, wherein the first potential difference is equal to $2*V_T$ and is used to power the logic circuit; and
   wherein the first photodiode is a bipolar junction transistor having a collector that is shorted to a base; the collector and the base of the bipolar junction transistor are electrically connected to the common substrate, and $V_T$ corresponds to the voltage drop across the base-emitter junction of said bipolar junction transistor.

2. The power supply of claim 1, wherein the common substrate is a P-type substrate and the bipolar junction transistor is a PNP bipolar junction transistor.

3. The power supply of claim 1, wherein the common substrate is a N-type substrate and the bipolar junction transistor is a NPN bipolar junction transistor.

4. The power supply of claim 1, wherein the second photodiode is a first PN diode having a first terminal electrically connected to the common substrate;

wherein, upon illumination, the power supply generates the first potential difference between an emitter of the bipolar junction transistor and a second electrode of the first PN diode; and wherein $V_T$ also corresponds to the threshold voltage of the first PN diode.

5. The power supply of claim 4, wherein the logic circuit is associated with a photo-activated transponder, and the power supply also powers an antenna associated with the photo-activated transponder, further comprising:

a third photodiode having at least one electrode in electrical contact with the common substrate;

wherein, upon illumination, the power supply generates a second potential difference across the third photodiode, and the second potential difference is used to power the antenna.

6. The power supply of claim 5, wherein the third photodiode is a second PN diode having a first electrode in electrical contact with the common substrate and a second opposite electrode in electrical contact with the antenna.

7. A method for powering a logic circuit, comprising the steps of:

providing at least first and second photodiodes connected in series and integrated on a common substrate, said first photodiode having a first terminal and a second terminal, said second photodiode having a first terminal and a second terminal, wherein said first terminal of said first photodiode and said first terminal of said second photodiode are in electrical contact with the common substrate;

illuminating the at least first and second photodiodes;

in response to said illuminating, generating a first potential difference between the second electrode of the first photodiode and the second electrode of the second photodiode, wherein the first potential difference is equal to $2*V_T$; and powering the logic circuit using the first potential difference;

wherein the first photodiode is a bipolar junction transistor having a collector that is shorted to a base; the collector and the base of the bipolar junction transistor are electrically connected to the common substrate, and $V_T$ corresponds to the voltage drop across the base-emitter junction of said bipolar junction transistor.

8. The method of claim 7, wherein the common substrate is a P-type substrate and the bipolar junction transistor is a PNP bipolar junction transistor.

9. The method of claim 7, wherein the common substrate is a N-type substrate and the bipolar junction transistor is a NPN bipolar junction transistor.

10. The method of claim 7, wherein the second photodiode is a first PN diode having a first terminal electrically connected to the common substrate;

wherein in response to said illuminating, the first potential difference is generated between an emitter of the bipolar junction transistor and a second electrode of the first PN diode; and wherein $V_T$ also corresponds to the threshold voltage of the first PN diode.

11. The method of claim 10, wherein the logic circuit is associated with a photo-activated transponder, further comprising the steps of:

providing a third photodiode having at least one electrode in electrical contact with the common substrate;

illuminating the third photodiode;

in response to said illuminating the third photodiode, generating a second potential difference across the third photodiode; and powering an antenna associated with the photo-activated transponder using the second potential difference.

12. The method of claim 11, wherein the third photodiode is a second PN diode having a first electrode in electrical contact with the common substrate and a second opposite electrode in electrical contact with the antenna.

* * * * *